(12) United States Patent
Karasawa et al.

(10) Patent No.: US 12,538,741 B2
(45) Date of Patent: Jan. 27, 2026

(54) RAW MATERIAL FEEDING DEVICE, SUBSTRATE PROCESSING SYSTEM, AND RESIDUAL ESTIMATION METHOD

(71) Applicant: Tokyo Electron Limited, Tokyo (JP)

(72) Inventors: Hiroyuki Karasawa, Yamanashi (JP); Tomohiro Saito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 528 days.

(21) Appl. No.: 17/939,457

(22) Filed: Sep. 7, 2022

(65) Prior Publication Data

US 2023/0070064 A1    Mar. 9, 2023

(30) Foreign Application Priority Data

Sep. 9, 2021   (JP) ................. 2021-147147

(51) Int. Cl.
  *H01L 21/67*      (2006.01)
  *G01F 22/02*      (2006.01)

(52) U.S. Cl.
  CPC ........ *H01L 21/67253* (2013.01); *G01F 22/02* (2013.01)

(58) Field of Classification Search
  CPC .............................................. H01L 21/67253
  See application file for complete search history.

(56) References Cited

U.S. PATENT DOCUMENTS

| | | | | |
|---|---|---|---|---|
| 2001/0016364 A1* | 8/2001 | Loan | ................... | C23C 16/4404 422/112 |
| 2002/0043215 A1* | 4/2002 | Yoshioka | ............. | B01D 1/0082 118/715 |
| 2002/0152809 A1* | 10/2002 | Shirai | ................... | G01F 23/248 73/299 |
| 2008/0191153 A1* | 8/2008 | Marganski | .............. | C23C 14/48 134/107 |
| 2012/0009706 A1* | 1/2012 | Choi | ........................ | C23C 14/24 118/712 |
| 2016/0047047 A1* | 2/2016 | Moroi | ................. | C23C 16/4481 118/712 |
| 2018/0265983 A1* | 9/2018 | Qian | .................. | C23C 16/45561 |
| 2020/0294820 A1* | 9/2020 | Shimizu | ................. | G05D 21/02 |
| 2021/0032751 A1* | 2/2021 | White | .................. | G01N 21/274 |
| 2023/0003704 A1* | 1/2023 | Shah | ..................... | C23C 16/448 |

FOREIGN PATENT DOCUMENTS

JP     2007-162139 A     6/2007

* cited by examiner

*Primary Examiner* — Keath T Chen
(74) *Attorney, Agent, or Firm* — Venjuris, P.C.

(57) ABSTRACT

A raw material feeding device includes: a raw material container that accommodates a solid or liquid raw material; an upstream path connected to the raw material container; a downstream path connected to the raw material container; a bypass path that connects the upstream path and the downstream path to each other without passing through the raw material container; a downstream side valve; a pressure gauge provided in at least one of the upstream path and the downstream path; and a remaining amount estimation unit that acquires a pressure detection value from the pressure gauge, and estimates a remaining amount of the raw material within the raw material container based on the pressure detection value decreased when the downstream side valve is opened at start of flowing of the raw material gas from the raw material container to the downstream path.

9 Claims, 9 Drawing Sheets

RAW MATERIAL FEEDING DEVICE, SUBSTRATE PROCESSING SYSTEM, AND RESIDUAL ESTIMATION METHOD

CROSS-REFERENCE TO RELATED APPLICATIONS

This application is based on and claims priority from Japanese Patent Application No. 2021-147147, filed on Sep. 9, 2021 with the Japan Patent Office, the disclosure of which is incorporated herein in its entirety by reference.

TECHNICAL FIELD

The present disclosure relates to a raw material feeding device, a substrate processing system, and a residual estimation method.

BACKGROUND

Japanese Patent Laid-Open Publication No. 2007-162139 discloses a raw material feeding device that circulates a carrier gas through a raw material container containing a raw material, so that a gas including the carrier gas and the raw material gas is supplied from the raw material container to a processing container.

In this type of raw material container, it is difficult to install a remaining amount sensor for detecting the remaining amount of a raw material due to the cost or durability. Thus, a conventional raw material feeding device estimates the remaining amount of the raw material within the raw material container based on, for example, a processing period of a substrate processing apparatus to which the raw material container is connected or the number of times the raw material gas of the raw material container is supplied (the number of processes), so as to make a notification about the replacement timing of the raw material container.

SUMMARY

According to an aspect, the present disclosure provides a raw material feeding device including: a raw material container that accommodates a solid or liquid raw material; an upstream path that is connected to the raw material container, and circulates a carrier gas therethrough; a downstream path that is connected to the raw material container, and circulates a gas containing a raw material gas generated from the raw material therethrough; a bypass path that connects the upstream path and the downstream path to each other without passing through the raw material container, and circulates the carrier gas from the upstream path to the downstream path; a downstream side valve that opens/closes a flow path of the downstream path; a pressure gauge that is provided in at least one of the upstream path and the downstream path, and detects a pressure within the upstream path or within the downstream path; and a remaining amount estimation unit that acquires a pressure detection value from the pressure gauge, and estimates a remaining amount of the raw material within the raw material container based on the pressure detection value decreased when the downstream side valve is opened at the start of circulating of the raw material gas from the raw material container to the downstream path.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
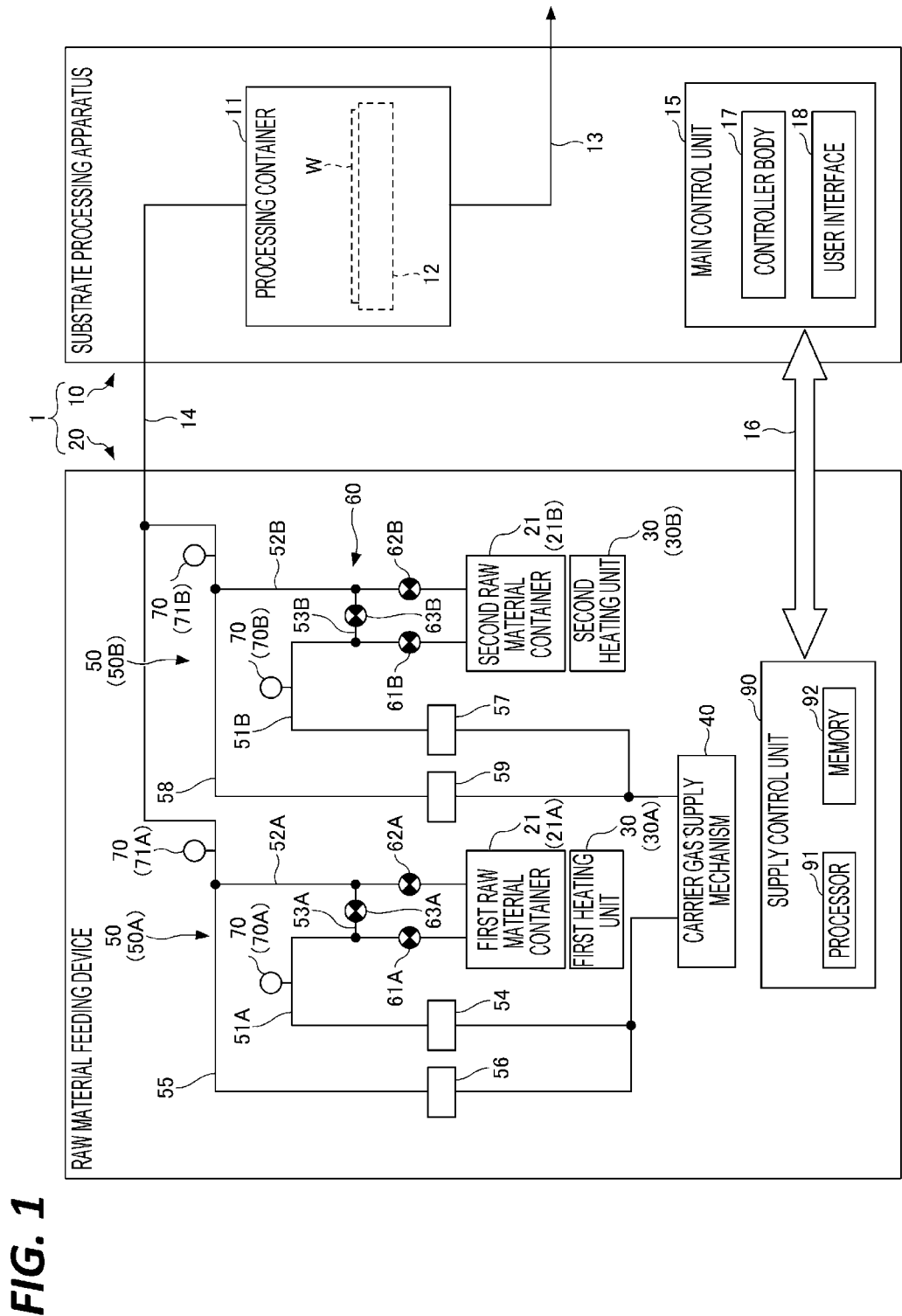
FIG. 1 is a schematic explanatory view illustrating the configuration of a substrate processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, an embodiment of the present disclosure will be described with reference to drawings. In the drawings, the same components may be denoted by the same reference numerals, and redundant descriptions may be omitted.

FIG. 1 is a schematic explanatory view illustrating the configuration of a substrate processing system 1 according to an embodiment. As illustrated in FIG. 1, the substrate processing system 1 includes a substrate processing apparatus 10 that processes a semiconductor wafer (hereinafter, simply referred to as a wafer W), which is an example of a substrate, and a raw material feeding device 20 that supplies a gas to be used during processing, to the substrate processing apparatus 10.

The substrate processing apparatus 10 is a semiconductor manufacturing apparatus such as a film forming apparatus. The substrate processing apparatus 10 includes a processing container 11 and a main control unit 15. When the substrate processing apparatus 10 is, for example, a film forming apparatus, the substrate processing apparatus 10 performs a film forming process on a wafer W accommodated within the processing container 11.

The processing container 11 is made of, for example, an aluminum alloy, and has a cylindrical shape. An opening through which the wafer W is loaded/unloaded to/from the processing container 11 is formed in the side wall of the processing container 11, and a gate valve for opening and sealing the opening is provided in the opening (both are not illustrated). Further, a stage 12 on which the wafer W is placed is provided within the processing container 11. The stage 12 has a chuck device that fixes the wafer W and a temperature adjusting unit that adjusts the temperature of the wafer W (both are not illustrated).

An exhaust path 13 is connected to the processing container 11 to exhaust a gas within the processing container 11. For example, a pressure adjustment valve, and a vacuum pump (both are not illustrated) are provided in the exhaust path 13. Furthermore, one end of a supply path 14 that supplies a gas is connected to the processing container 11. The other end of the supply path 14 is connected to the raw material feeding device 20. That is, the processing container 11 of the substrate processing apparatus 10 and the raw material feeding device 20 communicate with each other via the supply path 14.

The raw material feeding device 20 has a plurality of (two in FIG. 1) raw material containers 21. Hereinafter, one of the raw material containers 21 is referred to as a first raw material container 21A, and the other is referred to as a second raw material container 21B. Further, the raw material feeding device 20 includes a heating unit 30 that heats each raw material container 21, a carrier gas supply mechanism 40 that supplies a carrier gas to each raw material container 21, and a supply control unit 90 that controls each component of the raw material feeding device 20. The supply path 14, the raw material containers 21 and the carrier gas supply mechanism 40 are connected to each other by a plurality of gas paths 50. Further, the raw material feeding device 20 includes a plurality of opening/closing valves 60 in the gas paths 50 around the raw material containers 21.

Figure 2:
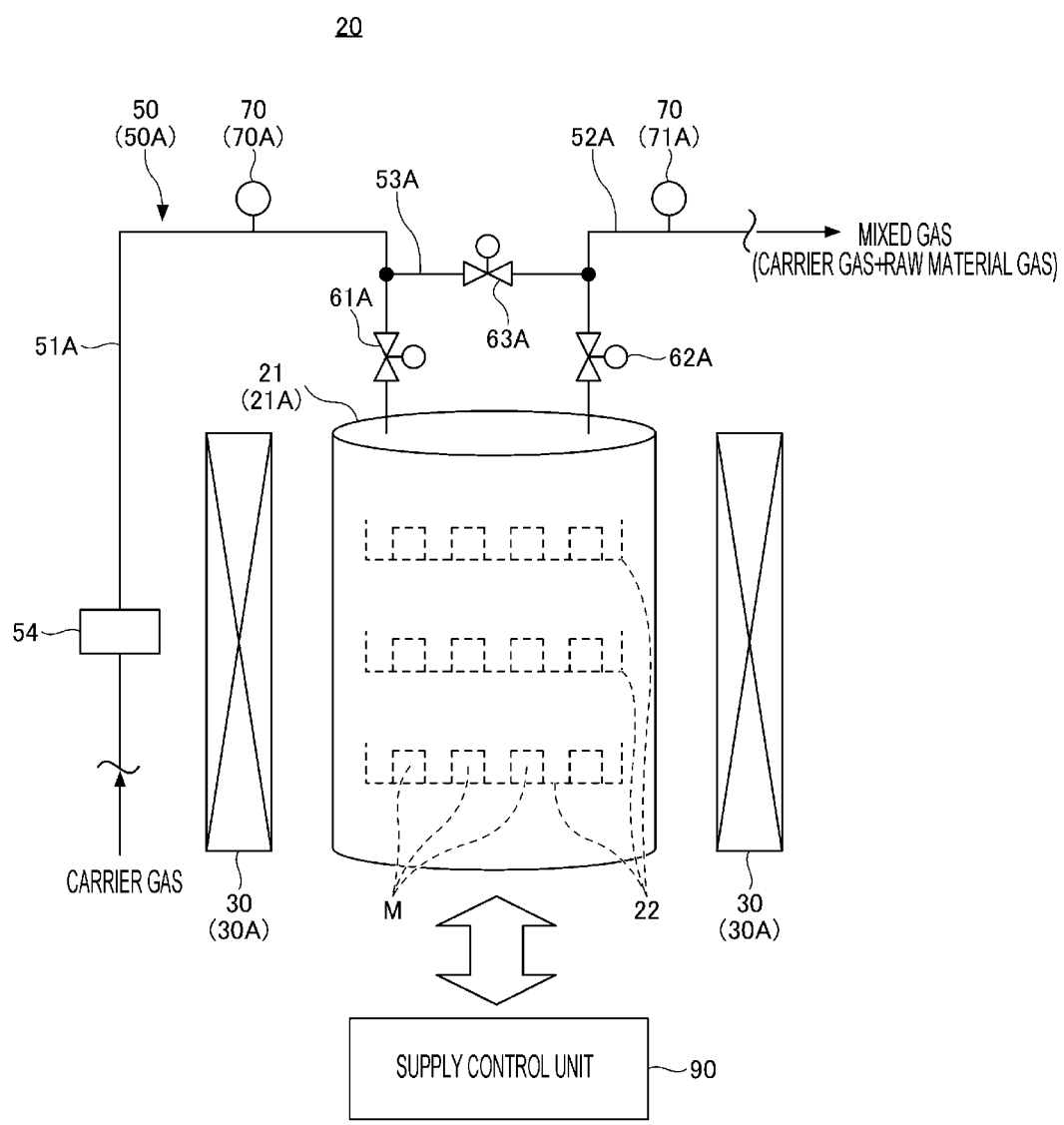
FIG. 2 is a schematic explanatory view illustrating the configuration of a raw material container and its surroundings.

FIG. 2 is a schematic explanatory view illustrating the configuration of the raw material container 21 (the first raw material container 21A) and its surroundings. As illustrated in FIG. 1 and FIG. 2, to the raw material container 21, a tank is applicable, which contains a plurality of raw materials M in advance, and is capable of vaporizing (sublimating) the raw materials M through heating of the heating unit 30. The raw material M in the raw material container 21 is not particularly limited, but examples thereof may include chloride compounds such as aluminum chloride ($AlCl_3$) or copper chloride (AlCu). Alternatively, the raw material M may be metal organics such as Si, Hf, Ta, Zr, Al, Ti, Zn, In, Ga, and P, or other solid raw materials or other liquid raw materials. In the present embodiment, descriptions will made on a case where aluminum chloride is used as the solid raw material M. In the present embodiment, "vaporization" is an expression that includes a concept of sublimation from a solid raw material to a gas, and a concept of evaporation from a liquid raw material to a gas.

The raw material M in the first raw material container 21A and the raw material M in the second raw material container 21B may be the same type of raw materials M, or may be different types of raw materials M. Although FIG. 1 illustrates an example related to two raw material containers 21, the raw material feeding device 20 may have a configuration where one raw material container 21 is provided, or three or more raw material containers 21 are provided. Hereinafter, the configuration of the first raw material container 21A and its surroundings will be described in detail. On the other hand, since the second raw material container 21B and its surroundings are formed in the same manner as the first raw material container 21A, the descriptions on the configuration thereof will be appropriately omitted.

As illustrated in FIG. 2, the first raw material container 21A is formed in a cylindrical shape or a square tube shape extending along the vertical direction. Within the first raw material container 21A, trays 22 are provided at approximately equal intervals along the vertical direction. One or more raw materials M are placed on each tray 22.

The first raw material container 21A is made of a material (e.g., alumina) with high thermal conductivity. The heating unit 30 (a first heating unit 30A) that heats the first raw material container 21A is provided outside the first raw material container 21A or on the peripheral wall of the container. The first heating unit 30A heats the raw materials M within the first raw material container 21A based on the control of the supply control unit 90. To the first heating unit 30A, for example, an electrothermal heater such as a sheathed heater, or a hand heater may be applied.

The carrier gas supply mechanism 40 selectively supplies a carrier gas to the gas path 50 (a first gas path 50A) connected to the first raw material container 21A and the gas path 50 (a second gas path 50B) connected to the second raw material container 21B. Examples of the carrier gas may include inert gases such as argon gas (Ar gas), helium gas (He gas), and nitrogen gas ($N_2$ gas). For example, the carrier gas supply mechanism 40 includes a supply source of the carrier gas, a regulator that reduces the pressure of the carrier gas sent from the supply source, and a valve that opens or shuts off the flow path of each gas path 50 (these are not illustrated).

The first gas path 50A includes a first upstream path 51A that connects the carrier gas supply mechanism 40 and the first raw material container 21A to each other, a first downstream path 52A that connects the first raw material container 21A and the supply path 14 to each other, and a first bypass path 53A that bypasses the first raw material container 21A. That is, the raw material feeding device 20 forms a primary side on which the carrier gas flows into the first raw material container 21A through the first upstream path 51A, and forms a secondary side on which the vaporized raw material gas flows out together with the carrier gas through the first downstream path 52A. The first bypass path 53A connects the first upstream path 51A and the first downstream path 52A to each other.

The opening/closing valve 60 around the first raw material container 21A includes a first upstream side valve 61A provided in the first upstream path 51A, a first downstream side valve 62A provided in the first downstream path 52A, and a first bypass side valve 63A provided in the first bypass path 53A. The first upstream side valve 61A is provided in the first upstream path 51A on the downstream side of the connection portion of the first bypass path 53A (on the first raw material container 21A side). The first downstream side valve 62A is provided in the first downstream path 52A on the upstream side of the connection portion of the first bypass path 53A (on the first raw material container 21A side).

Each opening/closing valve 60 is connected to the supply control unit 90, and opens (fully opens) and closes (fully closes) the flow path of each path based on the control of the supply control unit 90. Each opening/closing valve 60 allows a gas to flow through the flow path in an open state, and blocks the flow of the gas within the flow path in a closed state.

Further, the first upstream path 51A has a mass flow controller 54 and a pressure gauge 70 (a first upstream side pressure gauge 70A) as well as the first upstream side valve 61A. The first upstream path 51A may also have, for example, a safety valve, a constant pressure valve, a filter, and a heater.

The mass flow controller 54 is provided in the first upstream path 51A on the upstream side of the connection portion of the first bypass path 53A (on the carrier gas supply mechanism 40 side), and is connected to the supply control unit 90. The mass flow controller 54 adjusts the flow rate of the carrier gas supplied from the carrier gas supply mechanism 40 to the first raw material container 21A based on the control of the supply control unit 90.

The first upstream side pressure gauge 70A is provided between the mass flow controller 54 and the first upstream side valve 61A (and the connection portion of the first bypass path 53A). The first upstream side pressure gauge 70A detects the internal pressure of the flow path of a pipe constituting the first upstream path 51A (the pressure of the carrier gas), and transmits information of a pressure detection value to the supply control unit 90. To the first upstream side pressure gauge 70A, various detectors capable of detecting the total pressure (static pressure, dynamic pressure) may be applied. The first upstream side pressure gauge 70A may be provided in the first upstream path 51A on the upstream side of the mass flow controller 54.

The first downstream path 52A has a pressure gauge 70 (a first downstream side pressure gauge 71A) as well as the first downstream side valve 62A. The first downstream side pressure gauge 71A is provided on the downstream side of the first downstream side valve 62A (and the connection portion of the first bypass path 53A). The first downstream side pressure gauge 71A detects the internal pressure of the flow path of a pipe constituting the first downstream path 52A (the pressure of the carrier gas, and the raw material gas), and transmits information of a pressure detection value to the supply control unit 90.

Returning to FIG. 1, the gas path 50 of the raw material feeding device 20 further has a first branch path 55 diverging from the first upstream path 51A. The other end of the first branch path 55 is connected to the first downstream path 52A between the first downstream side valve 62A and the first downstream side pressure gauge 71A. A mass flow controller 56 is provided in the middle position of the first branch path 55. The mass flow controller 56 adjusts the flow rate of the carrier gas flowing from the first upstream path 51A to the first downstream path 52A via the first branch path 55.

Then, in the raw material feeding device 20, the surroundings of the second raw material container 21B are also configured in the same manner as the surroundings of the first raw material container 21A. That is, the heating unit 30 has a second heating unit 30B that heats the second raw material container 21B.

The second gas path 50B includes a second upstream path 51B that connects the carrier gas supply mechanism 40 and the second raw material container 21B to each other, a second downstream path 52B that connects the second raw material container 21B and the supply path 14 to each other, and a second bypass path 53B that bypasses the second raw material container 21B. Further, the opening/closing valve 60 around the second raw material container 21B includes a second upstream side valve 61B provided in the second upstream path 51B, a second downstream side valve 62B provided in the second downstream path 52B, and a second bypass side valve 63B provided in the second bypass path 53B.

The second upstream path 51B has a mass flow controller 57 and a second upstream side pressure gauge 70B as well as the second upstream side valve 61B. The second downstream path 52B has a second downstream side pressure gauge 71B as well as the second downstream side valve 62B. Further, the raw material feeding device 20 has a second branch path 58 that diverges from the second upstream path 51B, and is connected to the second downstream path 52B between the second downstream side valve 62B and the second downstream side pressure gauge 71B. A mass flow controller 59 is provided in the middle position of the second branch path 58.

The substrate processing system 1 having the substrate processing apparatus 10 and the raw material feeding device 20 controls the operation of the entire system by the main control unit 15 of the substrate processing apparatus 10. The supply control unit 90 of the raw material feeding device 20 is connected to the main control unit 15 via an appropriate communication unit 16, and operates based on commands from the main control unit 15 so as to control the operation of the raw material feeding device 20. The communication unit 16 may employ either wired communication or wireless communication, and may have a configuration in which control units are directly connected to each other, or a configuration using a network such as a local area network (LAN). In the configuration of the substrate processing system 1, the main control unit 15 may have a function of the supply control unit 90, and the supply control unit 90 may not be provided.

The main control unit 15 has a controller body 17 that controls the entire substrate processing system 1, and a user interface 18 that is connected to the controller body 17. The controller body 17 and the supply control unit 90 are configured by, for example, a computer or a control circuit board.

For example, the controller body 17 has a processor, a memory, an input/output interface, and an electronic circuit (these are not illustrated). When the processor executes a program recorded in the memory, the controller body 17 transmits/receives various signals to/from each component of the substrate processing system 1 so that substrate processing is performed.

To the user interface 18, for example, a keyboard by which a user performs a command input operation, etc., and a display on which the operating status of the substrate processing system 1 is visualized and displayed may be applied. Otherwise, to the user interface 18, devices such as a touch panel, a mouse, a microphone, and a speaker may be applied.

Further, the supply control unit 90 has one or more processors 91, a memory 92, and an input/output interface and an electronic circuit (not illustrated). The processor 91 is a combination of one or more of, for example, a CPU, an ASIC, an FPGA, and a circuit formed of a plurality of discrete semiconductors. The memory 92 includes a volatile memory, and a non-volatile memory (e.g., a compact disk, a DVD, a hard disk, or a flash memory), and stores a program of operating the raw material feeding device 20 and a recipe such as process conditions.

Figure 3:
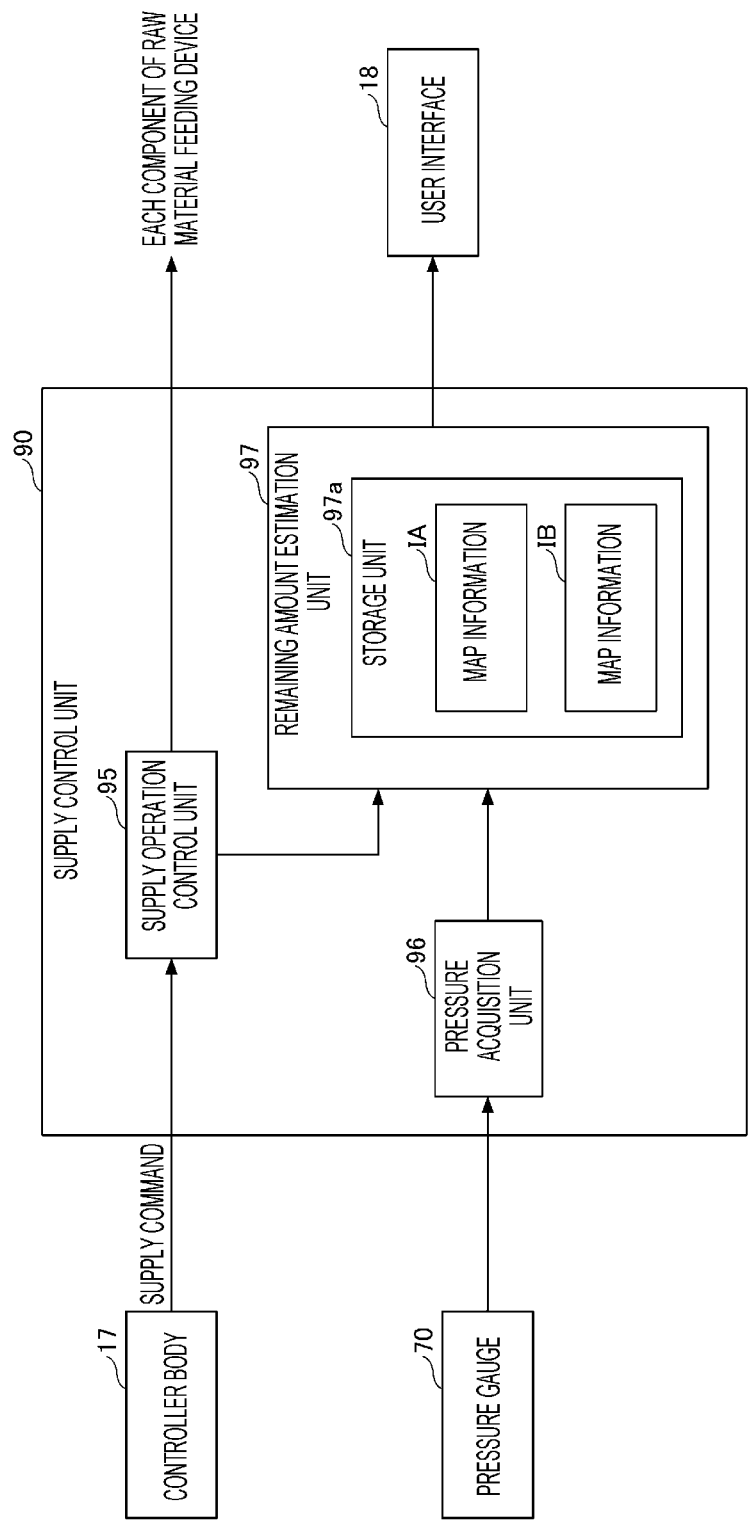
FIG. 3 is a block diagram illustrating functional units of a supply control unit.

FIG. 3 is a block diagram illustrating functional units of the supply control unit 90. As illustrated in FIG. 3, the supply control unit 90 forms a supply operation control unit 95, a pressure acquisition unit 96, and a remaining amount estimation unit 97 when the processor 91 executes the program or the recipe stored in the memory 92.

The supply operation control unit 95 operates based on supply commands received from the controller body 17, and transmits/receives various signals to/from each component of the raw material feeding device 20 so as to supply a gas to the substrate processing apparatus 10. The pressure acquisition unit 96 performs pressure detection by the pressure gauges 70 (the first upstream side pressure gauge 70A, the second upstream side pressure gauge 70B, the first downstream side pressure gauge 71A, and the second downstream side pressure gauge 71B), acquires pressure detection values and stores the pressure detection values in the memory 92.

Then, the remaining amount estimation unit 97 performs a residual estimation method of estimating the remaining amount of the raw materials M within the raw material container 21. That is, the processor 91 of the supply control unit 90 has a function of estimating the remaining amount of the raw materials M within the raw material container 21. In the substrate processing system 1, the remaining amount estimation unit 97 may be provided in the main control unit 15.

To estimate the remaining amount of the raw materials M within the first raw material container 21A, the remaining amount estimation unit 97 uses the pressure detection value of the first upstream side pressure gauge 70A or the pressure detection value of the first downstream side pressure gauge 71A, which is acquired by the pressure acquisition unit 96. As for the first upstream side pressure gauge 70A and the first downstream side pressure gauge 71A, detectors normally provided to monitor the pressure of the gas path 50 may be used, and thus, there is no need to separately provide a component for estimating the remaining amount of the raw materials M. The remaining amount estimation unit 97 estimates the remaining amount of the raw materials M in the first raw material container 21A based on the pressure detection value that is decreased when the first downstream side valve 62A is opened at the start of supplying of the raw material gas. A specific residual estimation method of the raw materials M will be described below in detail. Of course, the remaining amount estimation unit 97 may also estimate the remaining amount of the raw materials M within the second raw material container 21B through the same method as the residual estimation method for the first raw material container 21A.

The substrate processing system 1 and the raw material feeding device 20 according to the present embodiment are basically configured as described above, and hereinafter, the operations thereof will be described.

The main control unit 15 of the substrate processing apparatus 10 transmits, to the supply control unit 90, a command to supply a raw material gas to the processing container 11, at an appropriate timing when the wafer W is processed (e.g., after the placing of the wafer W on the stage 12 is ended, and the inside of the processing container 11 is depressurized). The supply control unit 90 that has received the supply command controls each component of the raw material feeding device 20 by the supply operation control unit 95 to start the supply of the raw material gas.

As illustrated in FIG. 2 and FIG. 3, at the start of supplying of the raw material gas (or after the raw material feeding device 20 is started), the supply operation control unit 95 operates the first heating unit 30A and the second heating unit 30B so as to heat the first raw material container 21A and the second raw material container 21B. Accordingly, the temperature is raised to a temperature at which the raw materials M within the first raw material container 21A may be vaporized, and the temperature is raised to a temperature at which the raw materials M within the second raw material container 21B may be vaporized.

Figure 4C:
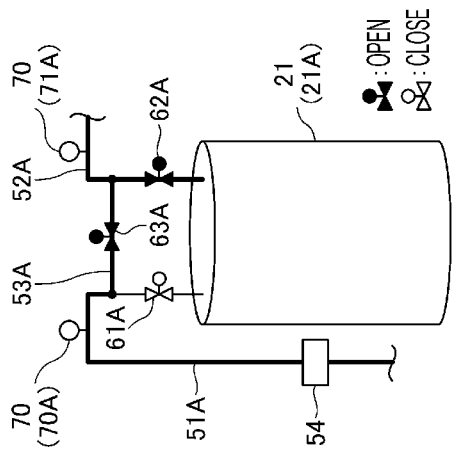
FIGS. 4A to 4E are schematic explanatory views illustrating an operation procedure at the start of supplying of a raw material gas.
Figure 4B:
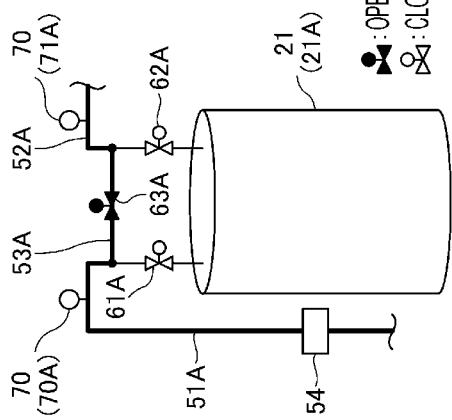
Figure 4E:
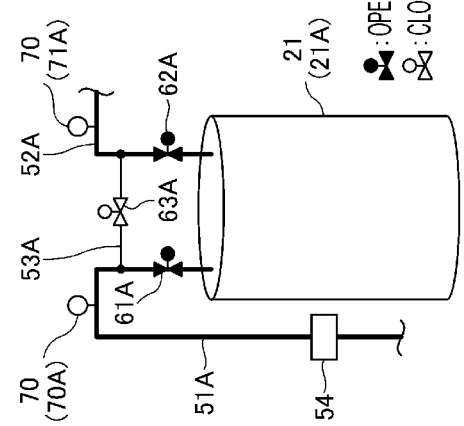
Figure 4A:
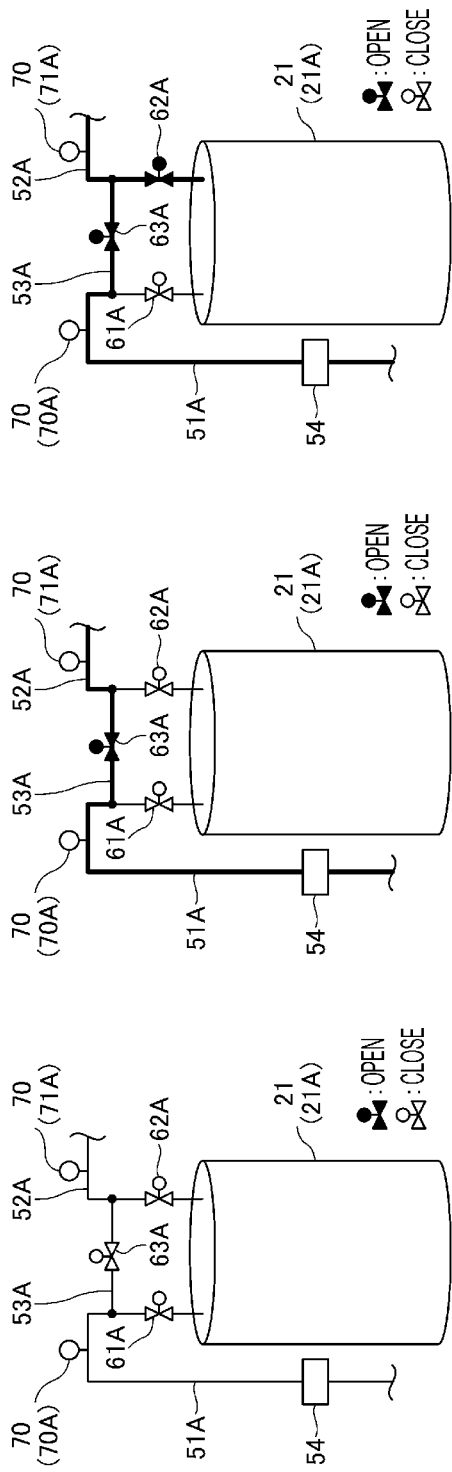
Figure 4D:
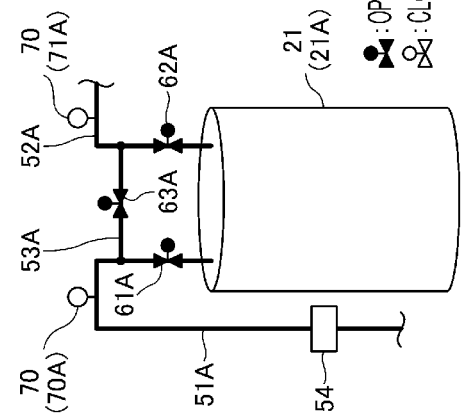

FIGS. 4A to 4E are schematic explanatory views illustrating an operation procedure at the start of supplying of the raw material gas. FIG. 4A illustrates a state before the start of the supply, FIG. 4B illustrates a first state after the start of the supply, FIG. 4C illustrates a second state after the first state, FIG. 4D illustrates a third state after the second state, and FIG. 4E illustrates a fourth state in which the raw material gas is continuously supplied after the third state. As illustrated in FIGS. 4A to 4E, the supply operation control unit 95 adjusts timings at which the three opening/closing valves 60 are opened/closed when the raw material gas is supplied from the first raw material container 21A.

Specifically, before the start of supplying of the raw material gas as illustrated in FIG. 4A, the raw material feeding device 20 closes the first upstream side valve 61A, the second upstream side valve 61B, and the first bypass side valve 63A. Further, the supply operation control unit 95 stops the supply of the carrier gas from the carrier gas supply mechanism 40 to the first gas path 50A. Upon receiving the command to start the supply of the raw material gas, the supply operation control unit 95 starts the supply of the carrier gas to the first gas path 50A from the carrier gas supply mechanism 40. The carrier gas supplied from the carrier gas supply mechanism 40 flows to the first branch path 55 from the first upstream path 51A. The flow rate of this carrier gas is adjusted by the mass flow controller 56 of the first branch path 55. The carrier gas flows into the first downstream path 52A from the first branch path 55, and then is supplied to the processing container 11 via the supply path 14.

Then, in a state where the carrier gas is flowing through the first branch path 55, as illustrated in FIG. 4B, first, the supply operation control unit 95 opens only the first bypass side valve 63A. Accordingly, under the control of each of the mass flow controllers 54 and 56, the carrier gas supplied from the carrier gas supply mechanism 40 is distributed to the first upstream path 51A and the first branch path 55. The carrier gas that has flowed into the first upstream path 51A flows into the first downstream path 52A from the first upstream path 51A through the first bypass path 53A. Further, the carrier gas joins with the carrier gas of the first branch path 55, in the first downstream path 52A, proceeds to the supply path 14, and is supplied to the processing container 11 via the supply path 14. The supply operation control unit 95 executes this first state in which only the first bypass side valve 63A is opened, for a predetermined period (e.g., for 1 sec).

Then, as illustrated in FIG. 4C, the supply operation control unit 95 opens the first downstream side valve 62A while the supply of the carrier gas from the carrier gas supply mechanism 40 to the first gas path 50A and the opening of the first bypass side valve 63A are continued. Accordingly, the raw material gas vaporized from the raw materials M in the first raw material container 21A flows out to the first downstream path 52A, and mixes with the carrier gas flowing through the first downstream path 52A. This mixed gas is supplied to the processing container 11 via the supply path 14. Further, the internal pressure of the first raw material container 21A is reduced as the vaporized raw material gas flows out. The supply operation control unit 95 executes this second state in which the first downstream side valve 62A and the first bypass side valve 63A are opened, for a predetermined period (e.g., for 1 sec).

Further, as illustrated in FIG. 4D, the supply operation control unit 95 opens the first upstream side valve 61A while the supply of the carrier gas from the carrier gas supply mechanism 40 to the first gas path 50A, and the opening of the first downstream side valve 62A and the first bypass side valve 63A are continued. Accordingly, one part of the carrier gas proceeds to the first raw material container 21A from the first upstream path 51A, and the other part of the carrier gas proceeds to the first downstream path 52A from the first upstream path 51A via the first bypass path 53A. That is, the pressure of the carrier gas is divided according to the pressure of the first raw material container 21A.

The carrier gas that has flowed into the first raw material container 21A becomes a mixed gas by mixing with the raw material gas, flows out to the first downstream path 52A, and is further mixed with the carrier gas in the first downstream path 52A. Then, the mixed gas is supplied to the processing container 11 via the supply path 14. The supply operation control unit 95 executes this third state in which the first upstream side valve 61A, the first downstream side valve 62A and the first bypass side valve 63A are opened, for a predetermined period (e.g., for 1 sec).

Further, as illustrated in FIG. 4E, the supply operation control unit 95 closes the first bypass side valve 63A while the supply of the carrier gas from the carrier gas supply mechanism 40 to the first gas path 50A, and the opening of the first upstream side valve 61A and the first downstream side valve 62A are continued. Accordingly, all the carrier gas in the first upstream path 51A flows into the first raw material container 21A, and mixes with the raw material gas within the first raw material container 21A. This mixed gas flows out to the first downstream path 52A from the first raw material container 21A, and is supplied to the processing container 11 via the first downstream path 52A and the supply path 14. The supply operation control unit 95 executes this fourth state in which the first upstream side valve 61A and the first downstream side valve 62A are opened, for a processing period during which the wafer W is processed.

Through the above control on each opening/closing valve 60, the raw material feeding device 20 may suppress a rapid pressure rise or pressure decrease within the first raw material container 21A or within the first gas path 50A at the start of supplying of the raw material gas. As a result, the raw material feeding device 20 may stably supply the carrier gas and the raw material gas to the processing container 11.

Next, descriptions will be made on a method of estimating the remaining amount of the raw materials M in the raw material container 21 by using the pressure detection value of the first upstream side pressure gauge 70A or the pressure detection value of the first downstream side pressure gauge 71A. FIG. 5A is a graph illustrating a change of the pressure detection value of the first upstream side pressure gauge 70A at the start of supplying of the raw material gas of the first raw material container 21A, in which the horizontal axis is time, and the vertical axis is the pressure detection value of the first upstream side pressure gauge 70A.

Curves of the plurality of pressure detection values illustrated in the graph of FIG. 5A are different from each other in the number of times the raw material gas is supplied from the first raw material container 21A to the processing container 11 by the operation of the raw material feeding device 20. That is, the number of times of supplying increases in order from thick curves to thin curves. Specifically, for the thickest curve, the number of times of supplying is 364, and for the thinnest curve, the number of times of supplying is 424. For other curves, extraction for the appropriate number of times of supplying between 364 times and 424 times was performed.

Further, in the graph of FIG. 5A, the start time point t0 is the timing when the state illustrated in FIG. 4A, which is prior to the start of supply, is switched to the first state illustrated in FIG. 4B (the start timing of the first state). The time point t1 is 1 sec after the start time point t0, and is the timing when the first state is switched to the second state illustrated in FIG. 4C (the start timing of the second state). The time point t2 is 2 sec after the start time point t0, and is the timing when the second state is switched to the third state illustrated in FIG. 4D (the start timing of the third state). The time point t3 is 3 sec after the start time point t0, and is the timing when the third state is switched to the fourth state illustrated in FIG. 4E (the start timing of the fourth state).

As illustrated in FIG. 5A, the pressure detection value of the first upstream side pressure gauge 70A decreases from the start time point t0 to the time point t3 after the start of supply, becomes the lowest value around the time point t3, and then, turns over and rises. Further, after the time point t3, the pressure detection value of the first upstream side pressure gauge 70A rises and falls once and then (after overshoot) gradually rises.

Further, the pressure detection value of the first upstream side pressure gauge 70A gradually rises whenever the number of times the raw material gas is supplied from the first raw material container 21A is increased. This is because whenever the number of times the raw material gas is supplied is increased, each of the mass flow controllers 54 and 56 increases the flow rate of the carrier gas flowing through the first upstream path 51A relative to the flow rate of the carrier gas flowing through the first branch path 55. Accordingly, even if the remaining amount of the raw material within the first raw material container 21A decreases, the supply amount of the raw material gas flowing out of the first raw material container 21A is secured.

Then, the pressure detection value of the first upstream side pressure gauge 70A decreases from the start time point t0 to the time point t3. Meanwhile, it can be seen that on the graph, the decrease amount (the absolute value) of the pressure detection value increases as the number of times the raw material gas is supplied increases. That is, the decrease amount is small on the dark-colored curve in which the number of times of supplying is small whereas the decrease of the pressure detection value is increased on the light-colored curve in which the number of times of supplying is large (see the arrows in FIG. 5A). The case where the number of times the raw material gas is supplied is small may be called a state where the remaining amount of the raw materials M is large, and the case where the number of times the raw material gas is supplied is large may be called a state where the remaining amount of the raw materials M is small. Therefore, at the start of supplying of the raw material gas from the first raw material container 21A, the remaining amount estimation unit 97 may estimate the remaining amount of the raw materials M within the first raw material container 21A by monitoring a decrease tendency of the pressure detection value of the first upstream side pressure gauge 70A.

For example, the remaining amount estimation unit 97 extracts the pressure detection value of the first upstream side pressure gauge 70A at the start time point t0, and the pressure detection value of the first upstream side pressure gauge 70A at the time point t2, and calculates a difference between these, that is, a pressure difference. The pressure difference between the pressure detection value at the start time point t0 and the pressure detection value at the time point t2 indicates a negative decrease value of the pressure detection value until 2 seconds have elapsed since the start of supplying (3 seconds to 1 seconds before the opening/closing valve 60 is placed in an open state in FIG. 4E). The absolute value of this negative decrease value corresponds to the above-described decrease amount. Then, when the negative decrease value which is the pressure difference is large (the decrease amount is small), the remaining amount of the raw materials M in the first raw material container 21A is large, whereas when the negative decrease value which is the pressure difference is small (the decrease amount is large), the remaining amount of the raw materials M in the first raw material container 21A is small. Therefore, the remaining amount estimation unit 97 may estimate that the remaining amount of the raw materials M in the first raw material container 21A is large when the calculated pressure difference is large, and may estimate that the remaining amount of the raw materials M in the first raw material container 21A is small when the calculated pressure difference is small.

Figure 5B:
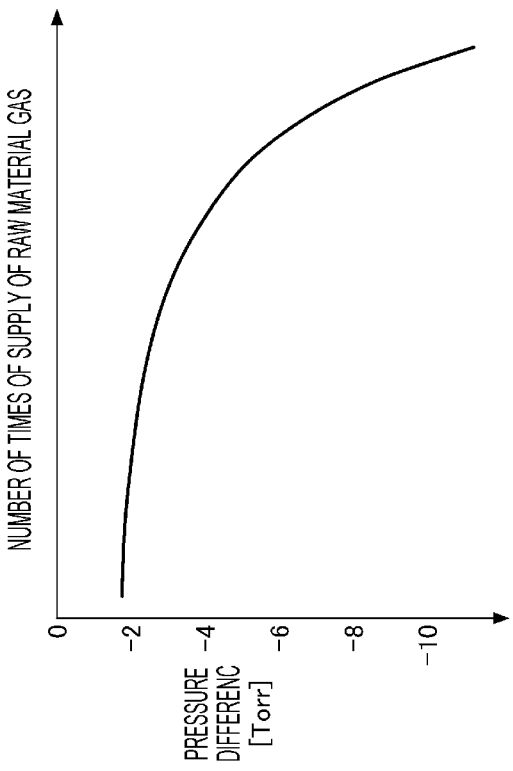
FIG. 5B is a graph illustrating a change of the pressure difference in the first upstream side pressure gauge with respect to the number of times the raw material gas is supplied, by an approximation curve.
Figure 5A:
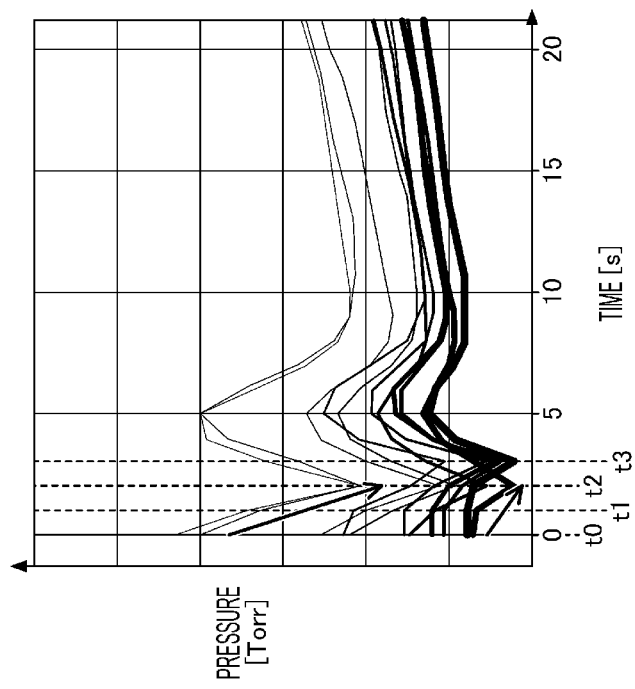
FIG. 5A is a graph illustrating a change of the pressure detection value of a first upstream side pressure gauge at the start of supplying of the raw material gas of a first raw material container.

FIG. 5B is a graph illustrating a change of the pressure difference in the first upstream side pressure gauge 70A with respect to the number of times the raw material gas is supplied, by an approximation curve, in which the horizontal axis is the number of times the raw material gas is supplied, and the vertical axis is the pressure difference. As illustrated in FIG. 5B, the approximation curve of the pressure difference of the first upstream side pressure gauge 70A gently falls when the number of times the raw material gas is supplied is small, and greatly falls when the number of times the raw material gas is supplied is large. It is thought that this is because as the remaining amount of the raw materials M within the first raw material container 21A is decreased, the surface areas of the raw materials M themselves decrease, and thus the raw material gas vaporized from the raw materials M is reduced, resulting in a decrease in the internal pressure in the raw material container 21.

Therefore, in the residual estimation method, the approximation curve is obtained as illustrated in FIG. 5B by performing, for example, experiments or simulations, and then based on this approximation curve, map information IA (see FIG. 3) or a function is created and is stored in a storage unit 97*a* (the memory 92) of the remaining amount estimation unit 97. For example, in the map information IA, the relationship between the pressure difference between the pressure detection values and the remaining amount of the raw materials M within the first raw material container 21A, is associated with, for example, the weight or the volume of the raw materials M. Since the vaporization amount (sublimation amount) of the raw materials M of the first raw material container 21A is affected by not only the remaining amount of the raw materials M, but also the vaporization time or the temperature of the first heating unit 30A, the map information is created based on data for which conditions of the vaporization time or the temperature are controlled. Alternatively, the remaining amount estimation unit 97 may have a plurality of map information pieces IA corresponding to a plurality of temperature zones of the raw material container 21 or vaporization time periods. The map information IA prepared in this manner may be reused as long as, for example, the device, the raw material M, or the component configuration of the raw material container 21 is not changed.

Meanwhile, when estimating the remaining amount of the raw materials M, the supply control unit 90 performs a control to equalize vaporization conditions (the pressure and the temperature of the first raw material container 21A) by which the raw materials M are vaporized. For example, as a method of making the vaporization conditions uniform, the supply operation control unit 95 may adopt a method of resetting the vaporization state of the raw materials M within the first raw material container 21A by opening the first upstream side valve 61A or the first downstream side valve 62A around the first raw material container 21A prior to estimation. The supply control unit 90 may decide not to perform a residual estimation method when the vaporization conditions are not the same due to factors such as the environment of a factory where the substrate processing system 1 is provided.

After calculating the pressure difference between the pressure detection values of the first upstream side pressure gauge 70A at the start of supplying of the raw material gas, the remaining amount estimation unit 97 obtains the remaining amount of the raw materials M within the first raw material container 21A with reference to the stored map information IA. As illustrated in the graph of FIG. 5A, in the pressure detection value of the first upstream side pressure gauge 70A, an error occurs in addition to a change of the number of times of supplying. For this reason, the remaining amount estimation unit 97 may obtain the remaining amount of the raw materials M within the first raw material container 21A by using the average value (moving average) of pressure detection values until the predetermined number of times is reached from the current number of times of supplying.

Figure 6B:
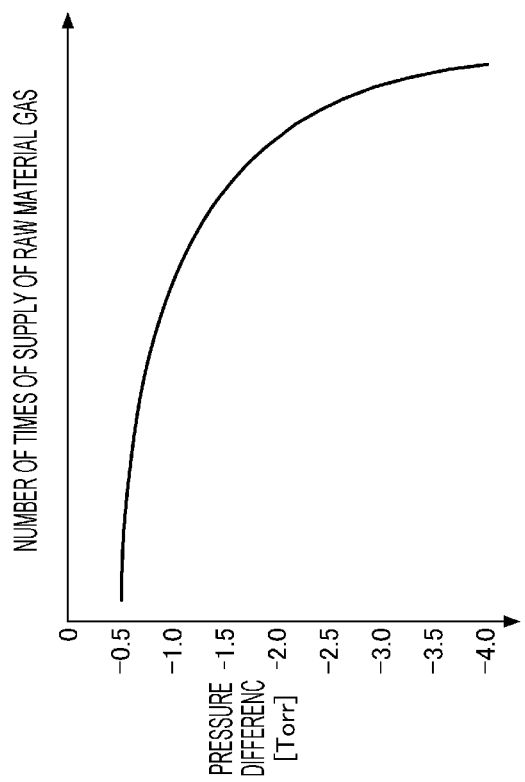
FIG. 6B is a graph illustrating a change of the pressure difference in the first downstream side pressure gauge with respect to the number of times the raw material gas is supplied, by an approximation curve.
Figure 6A:
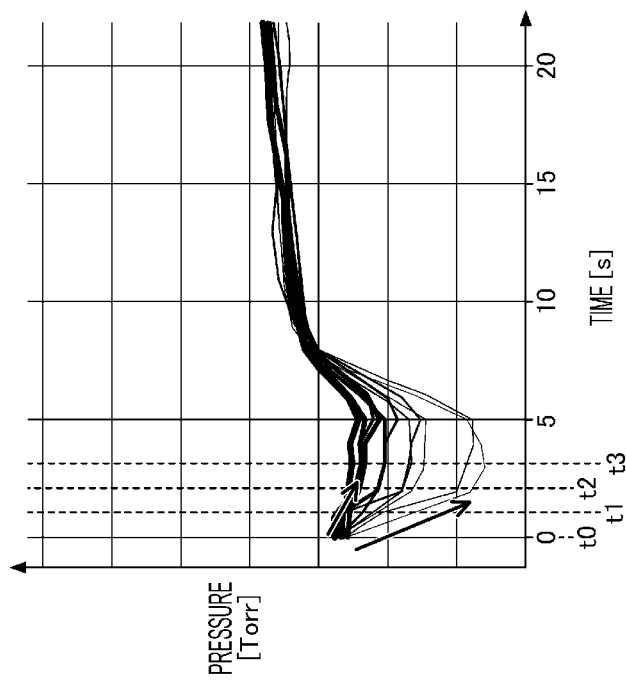
FIG. 6A is a graph illustrating a change of the pressure detection value of a first downstream side pressure gauge at the start of supplying of the raw material gas of the first raw material container.

FIG. 6A is a graph illustrating a change of the pressure detection value of the first downstream side pressure gauge 71A at the start of supplying of the raw material gas of the first raw material container 21A, in which the horizontal axis is time, and the vertical axis is the pressure detection value of the first downstream side pressure gauge 71A. As in the graph of FIG. 5A, curves of the plurality of pressure detection values illustrated in the graph of FIG. 6A are also different from each other in the number of times the raw material gas is supplied from the first raw material container 21A to the processing container 11. That is, the number of times of supplying increases in order from thick curves to thin curves. Further, in the graph of FIG. 6A, in a process from the start time point t0 to the time point t3, an operation on each opening/closing valve 60 is performed until the fourth state since before the start of supplying.

As illustrated in FIG. 6A, the pressure detection value of the first downstream side pressure gauge 71A decreases from the start time point t0 to the time point t3 after the start of supply, becomes the lowest value at the time point t3 or several seconds after the time point t3, and then, turns over and rapidly rises. Further, after about 8 seconds have elapsed from the start time point t0, the pressure detection value of the first downstream side pressure gauge 71A gradually gently rises. After 8 seconds have elapsed from the start time point t0, the pressure detection values of the first downstream side pressure gauge 71A are changed to substantially the same values regardless of the number of times the raw material gas is supplied. This is because the first downstream side pressure gauge 71A is located in the first downstream path 52A on the downstream side of the joining portion of the first branch path 55, in which carrier gases distributed to the first upstream path 51A and the first branch path 55 join together, thereby achieving the pressure stabilization.

Then, from the start time point t0 to the time point t3, it can be seen that the decrease amount (absolute value) of the pressure detection value of the first downstream side pressure gauge 71A also increases as the number of times the raw material gas is supplied increases. That is, the decrease amount is small on the thick curve in which the number of times of supplying is small whereas the decrease amount of the pressure detection value is increased on the thin curve in which the number of times of supplying is large (see arrows in FIG. 6A). Therefore, at the start of supplying of the raw material gas from the first raw material container 21A, the remaining amount estimation unit 97 may also estimate the remaining amount of the raw materials M within the first raw material container 21A by monitoring a decrease tendency of the pressure detection value of the first downstream side pressure gauge 71A.

For example, as in the case of the pressure detection value of the first upstream side pressure gauge 70A, the remaining amount estimation unit 97 extracts the pressure detection value of the first downstream side pressure gauge 71A at the start time point t0, and the pressure detection value of the first downstream side pressure gauge 71A at the time point t2, and calculates a difference between these, that is, a pressure difference (negative decrease value). When the pressure difference is large, the remaining amount of the raw materials M in the first raw material container 21A is large, whereas when the pressure difference is small, the remaining amount of the raw materials M in the first raw material container 21A is small. Therefore, the remaining amount estimation unit 97 may estimate that the remaining amount of the raw materials M in the first raw material container 21A is large when the calculated pressure difference is large, and may estimate that the remaining amount of the raw materials M in the first raw material container 21A is small when the calculated pressure difference is small.

FIG. 6B is a graph illustrating a change of the pressure difference in the first downstream side pressure gauge 71A with respect to the number of times the raw material gas is supplied, by an approximation curve, in which the horizontal axis is the number of times the raw material gas is supplied, and the vertical axis is the pressure difference. As illustrated in FIG. 6B, the approximation curve of the pressure difference of the first downstream side pressure gauge 71A also gently falls when the number of times the raw material gas is supplied is small, and greatly falls when the number of times the raw material gas is supplied is large. Thus, the remaining amount estimation unit 97 obtains the approximation curve as illustrated in FIG. 6B by performing, for example, experiments or simulations, and then, stores map information IB (see FIG. 3) or a function in advance based on this approximation curve. Then, after calculating the pressure difference between the pressure detection values of the first downstream side pressure gauge 71A at the start of supplying of the raw material gas, the remaining amount estimation unit 97 may obtain the remaining amount of the raw materials M within the first raw material container 21A with reference to the stored map information IB.

In the pressure detection value of the first downstream side pressure gauge 71A as well, an error occurs in addition to a change of the number of times of supplying. For this reason, the remaining amount estimation unit 97 may obtain the remaining amount of the raw materials M within the first raw material container 21A by using the average value (moving average) of pressure detection values until the predetermined number of times is reached from the current number of times of supplying.

The remaining amount estimation unit 97 may estimate the remaining amount of the raw materials M within the first raw material container 21A by using either the pressure difference between the pressure detection values of the first upstream side pressure gauge 70A or the pressure difference between the pressure detection values of the first downstream side pressure gauge 71A, but it is desirable that both are used. For example, the remaining amount estimation unit 97 may calculate an average value of the pressure difference between the pressure detection values of the first upstream side pressure gauge 70A, and the pressure difference between the pressure detection values of the first downstream side pressure gauge 71A, and estimate the remaining amount of the raw materials M within the first raw material container 21A with reference to map information (not illustrated) corresponding to the average value. Alternatively, the remaining amount estimation unit 97 may obtain the remaining amount of the raw materials M within the first raw material container 21A by using one of the pressure difference between the pressure detection values of the first upstream side pressure gauge 70A and the pressure difference between the pressure detection values of the first downstream side pressure gauge 71A, and then correct the obtained remaining amount by using the other.

Figure 7:
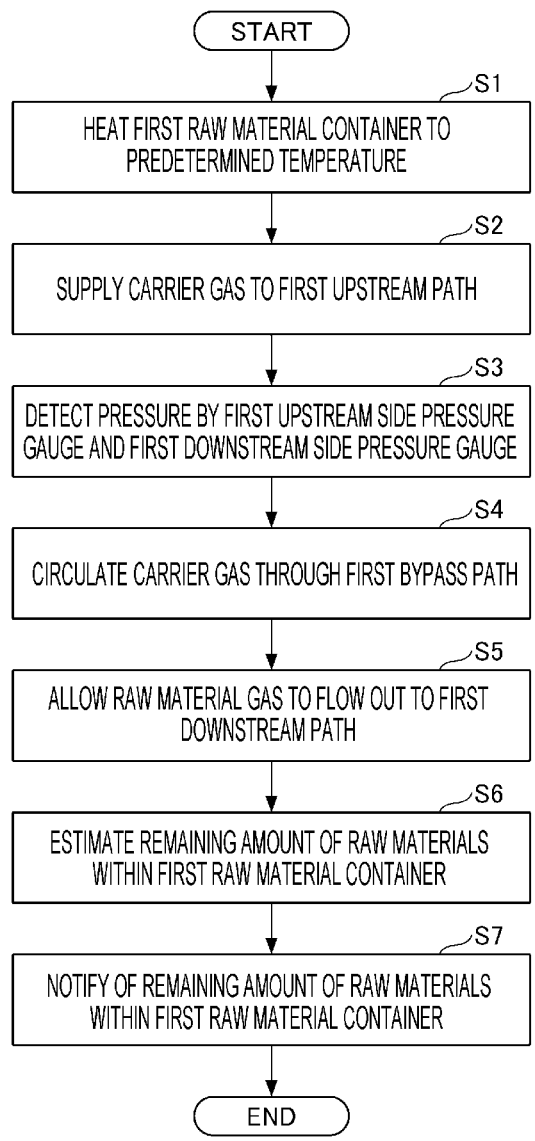
FIG. 7 is a flowchart illustrating the processing flow of a residual estimation method of the first raw material container.

FIG. 7 is a flowchart illustrating the processing flow of the residual estimation method of the first raw material container. Hereinafter, with reference to FIG. 7, descriptions will be made on the processing flow of the residual estimation method of the first raw material container 21A, in which the above-described processes of the substrate processing system 1 are summarized.

In performing the residual estimation method, the supply control unit 90 of the raw material feeding device 20 causes the supply operation control unit 95 to perform a process of starting supplying of the raw material gas from the first raw material container 21A. In the supply start process, the supply operation control unit 95 operates the first heating unit 30A to heat the first raw material container 21A to a predetermined temperature (step S1).

In a state where the first raw material container 21A is heated to a predetermined temperature, by the supply operation control unit 95, the carrier gas is supplied to (flows through) the first upstream path 51A connected to the first raw material container 21A, from the carrier gas supply mechanism 40 (step S2). Here, the supply operation control unit 95 adjusts the flow rate of the carrier gas directed to the first raw material container 21A, by the mass flow controllers 54 and 56.

Further, as the carrier gas flows, the pressure acquisition unit 96 detects the pressure of the first upstream path 51A by the first upstream side pressure gauge 70A, and detects the pressure of the first downstream path 52A by the first downstream side pressure gauge 71A (step S3). Then, in the supply start process of the raw material gas, the pressure acquisition unit 96 continuously acquires pressure detection values from the first upstream side pressure gauge 70A and the first downstream side pressure gauge 71A, and continues to accumulate the values in the memory 92.

The supply operation control unit 95 opens the first bypass side valve 63A so that the carrier gas flows through the first bypass path 53A while bypassing the first raw material container 21A (step S4: see also FIG. 4B). Accordingly, as illustrated in FIG. 5A or FIG. 6A, after the start time point t0, the pressure detection value of the first upstream side pressure gauge 70A and the pressure detection value of the first downstream side pressure gauge 71A gradually decrease.

Further, the supply operation control unit 95 opens the first downstream side valve 62A, so that a gas containing the raw material gas generated from the raw materials M of the first raw material container 21A flows through the first downstream path 52A (step S5: see also FIG. 4C). As the raw material gas flows out of the first raw material container 21A, even after the time point t1 illustrated in FIG. 5A or FIG. 6A, the pressure detection value of the first upstream side pressure gauge 70A and the pressure detection value of the first downstream side pressure gauge 71A gradually decrease.

Then, the remaining amount estimation unit 97 estimates the remaining amount of the raw materials M within the first raw material container 21A based on the pressure detection value decreased when the first downstream side valve 62A is opened (step S6). Here, the remaining amount estimation unit 97 acquires opening/closing timing information of each opening/closing valve 60 from the supply operation control unit 95, and extracts two pressure detection values, from the pressure detection values of the first upstream side pressure gauge 70A, the pressure detection values being accumulated in the memory 92. For example, the remaining amount estimation unit 97 extracts the pressure detection value of the first upstream side pressure gauge 70A at the start time point t0, and the pressure detection value of the first upstream side pressure gauge 70A at the time point t2, and calculates the pressure difference between the pressure detection values of the first upstream side pressure gauge 70A at the start of supplying of the raw material gas. Further, the remaining amount estimation unit 97 obtains the remaining amount in the first raw material container 21A based on the calculated pressure difference and the map information IA. Alternatively, the remaining amount estimation unit 97 extracts the pressure detection value of the first downstream side pressure gauge 71A at the start time point t0, and the pressure detection value of the first downstream side pressure gauge 71A at the time point t2, and calculates the pressure difference between the pressure detection values of the first downstream side pressure gauge 71A at the start of supplying of the raw material gas. Further, the remaining amount estimation unit 97 obtains the remaining amount in the first raw material container 21A based on the calculated pressure difference and the map information IB. When the remaining amount based on the pressure detection values of the first upstream side pressure gauge 70A and the remaining amount based on the pressure detection values of the first downstream side pressure gauge 71A are obtained, the remaining amount estimation unit 97 obtains the remaining amount of the raw materials M within the first raw material container 21A by appropriately performing calculations on these.

Then, the remaining amount estimation unit 97 notifies a user of the calculated remaining amount of the raw materials M within the first raw material container 21A, via the user interface 18 (step S7). Accordingly, the user of the substrate processing system 1 may recognize the remaining amount of the raw materials M within the first raw material container 21A, and then may schedule the replacement timing of the first raw material container 21A. The remaining amount estimation unit 97 may be configured to make a notification about the replacement timing of the first raw material container 21A, based on the calculated remaining amount of the raw materials M within the first raw material container 21A.

Then, for the remaining amount of the raw materials M within the second raw material container 21B, the remaining amount estimation unit 97 may also employ the same method as the residual estimation method for the raw materials M within the first raw material container 21A. That is, the remaining amount estimation unit 97 may estimate the remaining amount of the raw materials M within the second raw material container 21B based on the pressure detection value of the second upstream side pressure gauge 70B or the pressure detection value of the second downstream side pressure gauge 71B.

As described above, the raw material feeding device 20 and the substrate processing system 1 estimate the remaining amount of the raw materials M within the raw material container 21 by using the pressure gauges 70 around the raw material container 21. Accordingly, it is possible to directly monitor the remaining amount of the raw materials M within the raw material container 21 whose interior is not visible, by an index highly accurately correlated with the remaining amount of the raw materials M instead of conventional indirect estimation using the usage time or the number of processes.

The raw material feeding device 20, the substrate processing system 1 and the residual estimation method according to the present embodiment are not limited to those in the above-described embodiment, and various modifications may be made. For example, in the residual estimation method according to the above-described embodiment, as an index for estimating the remaining amount of the raw materials M, the pressure difference is calculated between the start time point t0 and the time point t2. However, in the residual estimation method, the pressure difference between the start time point t0 and the time point t3 may be used, or the pressure difference between the time point t1 and the time point t2 or the pressure difference between the time point t1 and the time point t3 may be used.

Figure 8B:
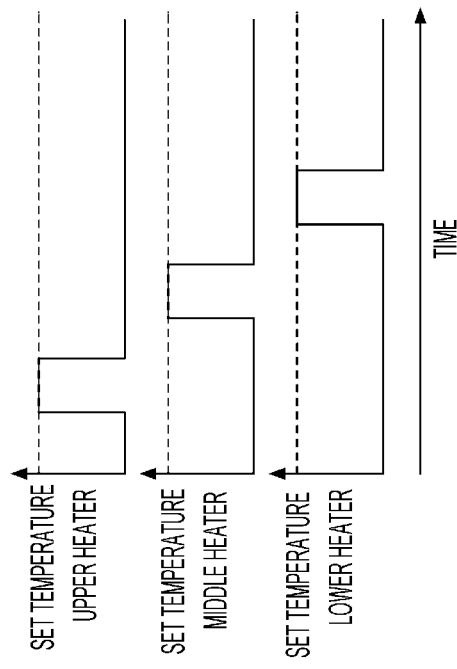
FIG. 8B is a timing chart illustrating the operation pattern of the heating unit.
Figure 8A:
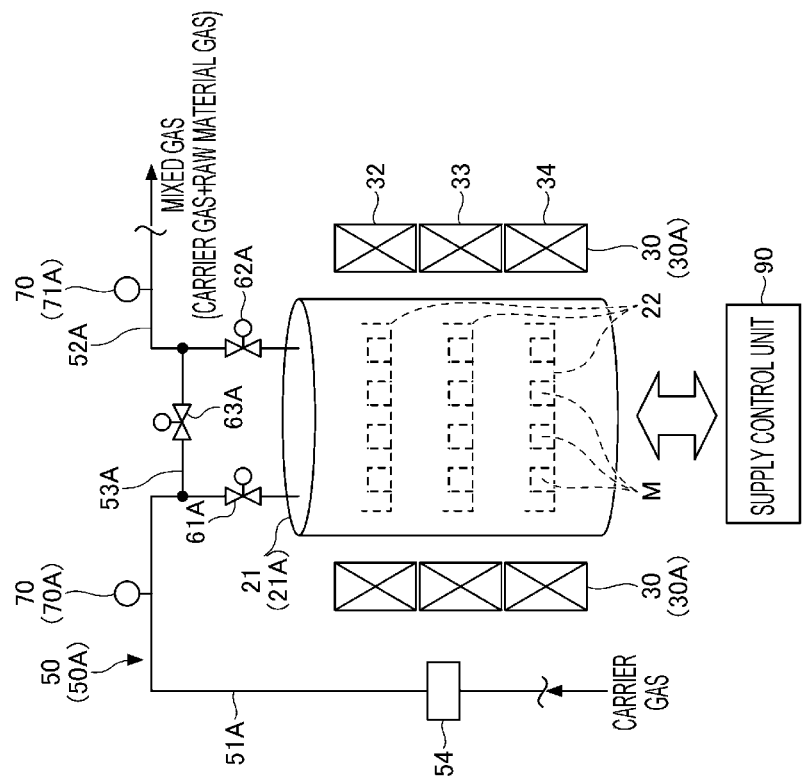
FIG. 8A is a schematic explanatory view illustrating a raw material container and a heating unit of a raw material feeding device according to a modification.

FIG. 8A is a schematic explanatory view illustrating the raw material container 21 and the heating unit 30 of the raw material feeding device 20 according to the modification, and FIG. 8B is a timing chart illustrating the operation pattern of the heating unit 30. As illustrated in FIG. 8A, the raw material feeding device 20 may have a configuration where the heating unit 30 is divided into a plurality of units along the trays 22 arranged in the vertical direction within the raw material container 21 (the first raw material container 21A, or the second raw material container 21B). For example, the heating unit 30 includes an upper heater 32, a middle heater 33 and a lower heater 34. Each of the heaters (the upper heater 32, the middle heater 33 and the lower heater 34) may effectively heat the raw materials M on the tray 22 arranged in the corresponding height region in the vertical direction.

Then, the supply control unit 90 (the supply operation control unit 95) of the raw material feeding device 20 individually controls each of the upper heater 32, the middle heater 33 and the lower heater 34. As an example, as illustrated in FIG. 8B, the supply operation control unit 95 operates the upper heater 32 at a predetermined set temperature, and then operates the middle heater 33 at a predetermined set temperature, and further subsequently, operates the lower heater 34 at a predetermined set temperature. Of course, any two or all three of the upper heater 32, the middle heater 33 and the lower heater 34 may be operated (perform heating) at the same time.

Further, in a state where the upper heater 32, the middle heater 33 and the lower heater 34 are individually operated, the remaining amount estimation unit 97 of the supply control unit 90 may estimate a variation in the remaining amounts of the raw materials M on the trays 22 by observing a decrease of a pressure detection value at the start of supplying of the raw material gas from the raw material container 21. That is, in the raw material container 21, between the trays 22 in the vertical direction, the consumption amount of the raw materials M may vary due to, for example, an individual difference or a piping layout. Due to this variation, for example, when the remaining amount of the raw materials M on one tray 22 is close to zero, even if the remaining amounts of the raw materials M on other trays 22 are large, the vaporization speed of the raw materials M is lowered, and the uniformity of the process during supplying of the raw material gas may not be maintained.

For example, the remaining amount estimation unit 97 estimates the remaining amount of the raw materials M on each of the trays 22 in the vertical direction based on a decrease of the pressure detection value when only the upper heater 32 is heated, a decrease of the pressure detection value when only the middle heater 33 is heated, and a decrease of the pressure detection value when only the lower heater 34 is heated. The estimated remaining amount of the raw materials M on each of the trays 22 may be a relative value between the trays 22, or an absolute value. Otherwise, the remaining amount estimation unit 97 may estimate the remaining amount of the raw materials M on each of the trays 22 based on a decrease of the pressure detection value when the upper heater 32 and the middle heater 33 are heated, when the upper heater 32 and the lower heater 34 are heated, or when the middle heater 33 and the lower heater 34 are heated.

Then, according to the variation in the remaining amounts of the raw materials M, which is estimated by the remaining amount estimation unit 97, the supply control unit 90 sends a feedback to the heating amount of the heating unit 30 during the subsequent substrate processing. Accordingly, the heating unit 30 individually adjusts the heating amount of each of the upper heater 32, the middle heater 33, and the lower heater 34. As a result, the raw material feeding device 20 reduces the variation in the remaining amounts of the raw materials M, so that on all the trays 22 within the raw material container 21, the performance in supplying of the raw material gas may be maintained until the remaining amounts of the raw materials M are close to zero.

Figure 9:
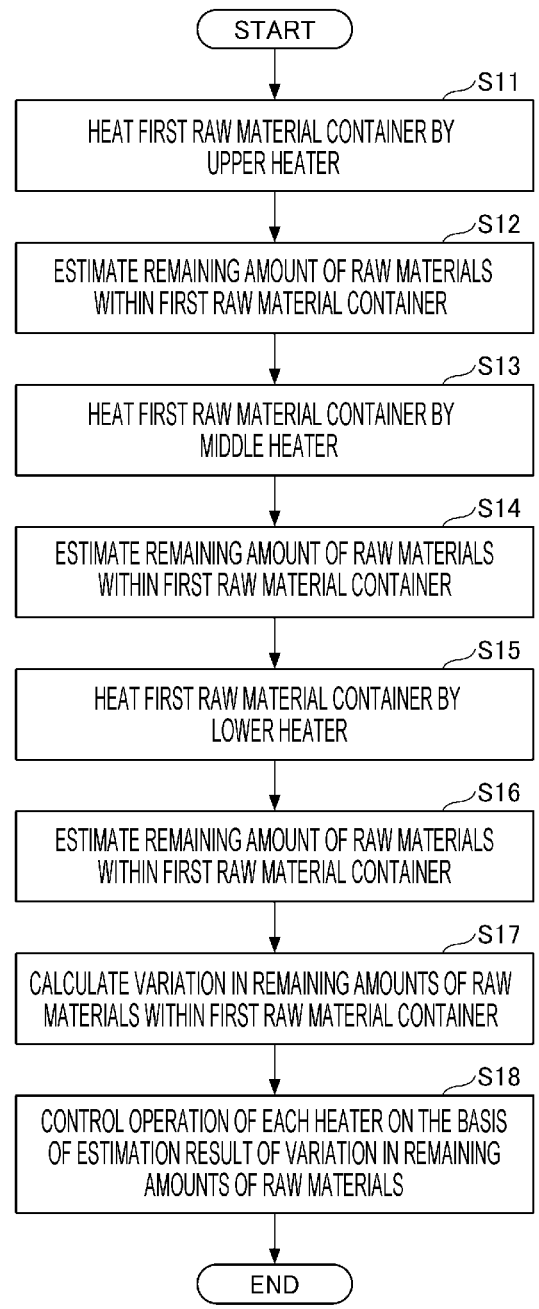
FIG. 9 is a flowchart illustrating an example of the processing flow of a residual estimation method according to the modification.

FIG. 9 is a flowchart illustrating an example of the processing flow of the residual estimation method according to the modification. As illustrated in FIG. 9, in the residual estimation method for estimating a variation in the raw materials M, first, the supply operation control unit 95 heats the first raw material container 21A only by the upper heater 32 (step S11). Then, the remaining amount estimation unit 97 estimates the remaining amount of the raw materials M within the first raw material container 21A based on the pressure detection value of the first upstream side pressure gauge 70A or the pressure detection value of the first downstream side pressure gauge 71A at this time (step S12). In the estimation of the remaining amount of the raw materials M within the first raw material container 21A, the same process as that in the processing flow of FIG. 7 may be performed. On the remaining amount of the raw materials M in the first raw material container 21A, which is calculated in step S12, the outflow amount of the raw material gas generated from the raw materials M on the upper tray 22 is mainly reflected. Meanwhile, the raw material gas also flows out of the raw materials M on other trays 22.

Therefore, subsequently, in supplying of the raw material gas to the substrate processing apparatus 10, the supply operation control unit 95 heats the first raw material container 21A only by the middle heater 33 (step S13). Then, the remaining amount estimation unit 97 estimates the remaining amount of the raw materials M within the first raw material container 21A based on the pressure detection value of the first upstream side pressure gauge 70A or the pressure detection value of the first downstream side pressure gauge 71A at this time (step S14). On the remaining amount of the raw materials M in the first raw material container 21A, which is calculated in step S14, the outflow amount of the raw material gas generated from the raw materials M on the center-side tray 22 is mainly reflected. Meanwhile, the raw material gas also flows out of the raw materials M on other trays 22.

Further, in supplying of the raw material gas to the substrate processing apparatus 10, the supply operation control unit 95 heats the first raw material container 21A only by the lower heater 34 (step S15). Then, the remaining amount estimation unit 97 estimates the remaining amount of the raw materials M within the first raw material container 21A based on the pressure detection value of the first upstream side pressure gauge 70A or the pressure detection value of the first downstream side pressure gauge 71A at this time (step S16). On the remaining amount of the raw materials M in the first raw material container 21A, which is calculated in step S16, the outflow amount of the raw material gas generated from the raw materials M on the lower tray 22 is mainly reflected. Meanwhile, the raw material gas also flows out of the raw materials M on other trays 22.

Then, the remaining amount estimation unit 97 calculates a variation in the remaining amounts of the raw materials M within the first raw material container 21A by using the remaining amount in the heating of the upper heater 32, the remaining amount in the heating of the middle heater 33, and the remaining amount in the heating of the lower heater 34 (step S17). For example, the remaining amount estimation unit 97 sets X, Y, and Z for the remaining amount in the heating of the upper heater 32, the remaining amount in the heating of the middle heater 33, and the remaining amount in the heating of the lower heater 34, respectively, and also uses parameters which are stored in advance, such as the heating temperature of each heater, and the degree of influence on the raw materials M. Then, the remaining amount estimation unit 97 estimates a variation of remaining amounts of the raw materials M by an appropriate arithmetic expression (as an example, a simultaneous equation).

Then, based on the estimation result of the variation in the remaining amounts of the raw materials M, the supply control unit 90 controls the operations of the upper heater 32, the middle heater 33, and the lower heater 34 when the raw material gas is supplied from the first raw material container 21A to the processing container 11 (step S18). For example, the supply operation control unit 95 individually adjusts, for example, the heating timing, the heating period, and the temperature of each heater by using the estimation result. Therefore, the raw material feeding device 20 may substantially equalize the remaining amounts of the raw materials M in the first raw material container 21A. Of course, the raw material feeding device 20 may also perform the same process on the second raw material container 21B.

Hereinafter, technical ideas and effects of the present disclosure, which have been described in the above embodiment, will be described.

A raw material feeding device 20 according to a first aspect of the present disclosure includes: a raw material container 21 that accommodates a solid or liquid raw material M; an upstream path (the first upstream path 51A) that is connected to the raw material container 21, and circulates a carrier gas therethrough; a downstream path (the first downstream path 52A) that is connected to the raw material container 21, and circulates a gas containing a raw material gas generated from the raw material M therethrough; a bypass path (the first bypass path 53A) that connects the upstream path and the downstream path to each other without passing through the raw material container 21, and circulates the carrier gas from the upstream path to the downstream path; a downstream side valve (the first downstream side valve 62A) that opens/closes a flow path of the downstream path; a pressure gauge 70 that is provided in at least one of the upstream path and the downstream path, and detects a pressure within the upstream path or within the downstream path; a remaining amount estimation unit 97 that acquires a pressure detection value from the pressure gauge 70, and estimates the remaining amount of the raw material M within the raw material container 21, based on the pressure detection value decreased when the downstream side valve is opened at the start of circulating the raw material gas from the raw material container 21 to the downstream path.

The above-described raw material feeding device 20 uses the pressure detection value of the pressure gauge 70 at the start of flowing of the raw material gas. Thus, it is possible to more directly grasp the state of the raw material M within the raw material container 21, and to accurately estimate the remaining amount of the raw material M within the raw material container 21. Accordingly, the raw material feeding device 20 may use the raw material M within the raw material container 21 to near the limit, thereby reducing the number of times of replacement of the raw material container 21 or waste raw materials, and reducing a running cost. Further, since it is possible to use the pressure gauge 70 that is normally applied around the raw material container 21, the raw material feeding device 20 does not need to have a remaining amount sensor or a concentration sensor provided in the raw material container 21. This may suppress a cost. Further, the raw material feeding device 20 circulates the carrier gas to the downstream path (the first downstream path 52A) via the bypass path (the first bypass path 53A) so that the pressure of the upstream path (the first upstream path 51A) or the downstream path may may be stabilized. In this state, it is possible to accurately grasp a pressure decrease by monitoring the pressure detection value when the downstream side valve (the first downstream side valve 62A) is opened.

Further, the remaining amount estimation unit 97 calculates a decrease amount of the pressure detection value, and estimates that the remaining amount of the raw material M decreases within the raw material container 21 as the decrease amount increases. Accordingly, the raw material feeding device 20 may recognize that when the decrease amount of the pressure detection value is increased, the remaining amount of the raw material M is small.

Further, map information (IA, IB) is stored in a storage unit 97a, in which the decrease amount of the pressure detection value is associated with the remaining amount of the raw material M within the raw material container 21. The remaining amount estimation unit 97 refers to the storage unit 97a based on the calculated decrease amount of the pressure detection value, and extracts the remaining amount of the raw material M within the raw material container 21 from the map information (IA, IB). Accordingly, the remaining amount estimation unit may simply obtain the remaining amount of the raw material M within the raw material container 21 according to the decrease amount of the pressure detection value.

Further, the raw material feeding device 20 includes a bypass side valve (the first bypass side valve 63A) that opens/closes a flow path of the bypass path (the first bypass path 53A). The remaining amount estimation unit 97 estimates the remaining amount of the raw material M within the raw material container 21 based on the pressure detection value when the bypass side valve is opened and the downstream side valve (the first downstream side valve 62A) is opened at the start of flowing of the raw material gas from the raw material container 21 to the downstream path (the first downstream path 52A). The raw material feeding device 20 circulates the carrier gas through the bypass path by opening the bypass side valve, and this may suppress a rapid pressure rise in the raw material container 21, which is caused when the carrier gas flows into the raw material container 21. Then, the remaining amount estimation unit may stably estimate the remaining amount of the raw material M within the raw material container 21 based on a decrease of the pressure detection value when both the bypass side valve and the downstream side valve are opened.

Further, the raw material feeding device 20 includes an upstream side valve (the first upstream side valve 61A) that opens/closes a flow path of the upstream path (the first upstream path 51A). The remaining amount estimation unit 97 estimates the remaining amount of the raw material M within the raw material container 21 based on the pressure detection value when the bypass side valve (the first bypass side valve 63A) is opened, the downstream side valve (the first downstream side valve 62A) is opened, and the upstream side valve is opened at the start of flowing of the raw material gas from the raw material container 21 to the downstream path (the first downstream path 52A). Accordingly, the raw material feeding device 20 allows the carrier gas to smoothly flow from the upstream path to the raw material container 21. Further, at this time, a decrease of the pressure detection value may also be used to appropriately estimate the remaining amount of the raw material M within the raw material container 21.

Further, the pressure gauge 70 is provided in each of the upstream path (the first upstream path 51A) and the downstream path (the first downstream path 52A). The remaining amount estimation unit 97 estimates the remaining amount of the raw material M within the raw material container 21 by using both a pressure detection value of the pressure gauge 70 in the upstream path, and a pressure detection value of the pressure gauge 70 in the downstream path. Accordingly, the raw material feeding device 20 may more accurately estimate the remaining amount of the raw material M within the raw material container 21.

Further, the raw material feeding device 20 includes a plurality of heating units 30 (the upper heater 32, the middle heater 33, and the lower heater 34) that heat the raw material container 21. The remaining amount estimation unit 97 estimates a variation in remaining amounts of raw materials M accommodated within the raw material container 21 based on selective heating of a part of the heating units 30. Accordingly, the raw material feeding device 20 may estimate the remaining amount of the raw materials M in each of regions corresponding to the heating units 30, and may control the heating units 30 according to a variation in the remaining amounts of the raw materials M, thereby reducing a variation in the remaining amounts of the raw materials M.

Further, according to a second aspect of the present disclosure, a substrate processing system 1 includes: a supply path 14 connected to the processing container 11 in which a substrate is processed; a raw material container 21 that accommodates a solid or liquid raw material M; an upstream path (the first upstream path 51A) that is connected to the raw material container 21, and circulates a carrier gas therethrough; a downstream path (the first downstream path 52A) that connects the raw material container 21 and the supply path 14 to each other, and circulates a gas containing a raw material gas generated from the raw material M therethrough; a bypass path (the first bypass path 53A) that connects the upstream path and the downstream path to each other without passing through the raw material container 21, and circulates the carrier gas from the upstream path to the downstream path; a downstream side valve (the first downstream side valve 62A) that opens/closes a flow path of the downstream path; a pressure gauge 70 that is provided in at least one of the upstream path and the downstream path, and detects a pressure within the upstream path or within the downstream path; and a remaining amount estimation unit 97 that acquires a pressure detection value from the pressure gauge 70, and estimates the remaining amount of the raw material M within the raw material container 21 based on the pressure detection value decreased when the downstream side valve is opened at the start of flowing of the raw material gas from the raw material container 21 to the downstream path.

Further, according to a third aspect of the present disclosure, a residual estimation method includes: circulating a carrier gas to flow through an upstream path (the first upstream path 51A) connected to a raw material container 21 that accommodates a sold or liquid raw material M; circulating the carrier gas from the upstream path to a downstream path connected to the raw material container 21 through a bypass path (the first bypass path 53A) that connects the upstream path and the downstream path (the first downstream path 52A) to each other, without passing through the raw material container 21; opening a downstream side valve (the first downstream side valve 62A) provided in the downstream path, thereby circulating a gas containing a raw material gas generated from the raw material M through the downstream path; detecting a pressure within the upstream path or within the downstream path by a pressure gauge 70 provided in at least one of the upstream path and the downstream path; and acquiring a pressure detection value from the pressure gauge 70, and estimating the remaining amount of the raw material M within the raw material container 21, based on the pressure detection value decreased when the downstream side valve is opened at the start of circulating the raw material gas from the raw material container 21 to the downstream path.

In the above-described second and third aspects as well, it is possible to accurately estimate the remaining amount of the raw material M within the raw material container 21.

The raw material feeding device 20, the substrate processing system 1 and the residual estimation method according to the embodiment disclosed herein are examples in every way, and are not restrictive.

The substrate processing system 1 of the present disclosure is applicable to any type of device such as an atomic layer deposition (ALD) device, and capacitively coupled plasma (CCP), inductively coupled plasma (ICP), radial line slot antenna (RLSA), electron cyclotron resonance plasma (ECR), and helicon wave plasma (HWP) devices.

According to an aspect, it is possible to accurately estimate the remaining amount of the raw material within the raw material container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A raw material feeding device comprising:
   a raw material container configured to accommodate a solid or liquid raw material;
   an upstream path connected to the raw material container and configured to circulate a carrier gas therethrough;
   a downstream path connected to the raw material container and configured to circulate a gas containing a raw material gas generated from the raw material therethrough;
   a bypass path configured to connect the upstream path and the downstream path to each other without passing through the raw material container, and circulate the carrier gas from the upstream path to the downstream path;
   a downstream side valve configured to open/close a flow path of the downstream path;
   a bypass side valve configured to open/close a flow path of the bypass path;
   an upstream side valve configured to open/close a flow path of the upstream path;
   a pressure gauge provided in at least one of the upstream path and the downstream path, and configured to detect a pressure within the upstream path or within the downstream path while the raw material gas is circulated from the raw material container to the upstream path or the downstream path; and
   a remaining amount estimation circuitry configured to:
      acquire a first pressure detection value when the bypass side valve is opened and the downstream side valve and the upstream side valve are closed, and acquire a second pressure detection value when the bypass side valve, the downstream side valve, and the upstream side valve are opened, from the pressure gauge,
      calculate a first pressure difference as a decrease amount of a pressure detection value between the first and second pressure detection values, and
      estimate a remaining amount of the raw material within the raw material container based on the calculated first pressure difference.

2. The raw material feeding device according to claim 1, wherein the remaining amount estimation circuitry estimates that the remaining amount of the raw material decreases within the raw material container as the decrease amount increases.

3. The raw material feeding device according to claim 2, wherein a storage stores map information in which the decrease amount of the pressure detection value is associated with the remaining amount of the raw material within the raw material container, and
   the remaining amount estimation circuitry refers to the storage based on the decrease amount of the pressure detection value calculated by the remaining estimation circuitry, and extracts the remaining amount of the raw material within the raw material container from the map information.

4. The raw material feeding device according to claim 1, wherein the remaining amount estimation circuitry acquires a third pressure detection value from the pressure gauge when the bypass side valve is closed and the downstream side valve and the upstream side valve are opened, calculates a second pressure difference between the first and third pressure detection values, and estimates the remaining amount of the raw material within the raw material container based on the calculated the second pressure difference.

5. The raw material feeding device according to claim 1, wherein the pressure gauge is provided in each of the upstream path and the downstream path, and
the remaining amount estimation circuitry estimates the remaining amount of the raw material within the raw material container by using both the first pressure difference in the upstream path, and a second pressure difference in the downstream path.

6. The raw material feeding device according to claim 5, wherein the remaining amount estimation circuitry calculates an average value of the first and second pressure differences, and estimates the remaining amount of the raw material within the raw material container with reference to map information corresponding to the average value.

7. The raw material feeding device according to claim 1, further comprising:
a plurality of heaters configured to heat the raw material container,
wherein the remaining amount estimation circuitry estimates a variation in remaining amounts of raw materials accommodated within the raw material container based on selective heating of a part of the heaters.

8. A substrate processing system comprising:
a supply path connected to a processing container in which a substrate is processed;
a raw material container configured to accommodate a solid or liquid raw material;
an upstream path connected to the raw material container and configured to circulate a carrier gas therethrough;
a downstream path configured to connect the raw material container and the supply path to each other, and configured to circulate a gas containing a raw material gas generated from the raw material therethrough;
a bypass path configured to connect the upstream path and the downstream path to each other without passing through the raw material container, and configured to circulate the carrier gas to flow from the upstream path to the downstream path;
a downstream side valve configured to open/close a flow path of the downstream path;
a bypass side valve configured to open/close a flow path of the bypass path;
an upstream side valve configured to open/close a flow path of the upstream path;
a pressure gauge provided in at least one of the upstream path and the downstream path, and configured to detect a pressure within the upstream path or within the downstream path while the raw material gas is circulated from the raw material container to the upstream path or the downstream path; and
a remaining amount estimation circuitry configured to:
acquire a first pressure detection value when the bypass side valve is opened and the downstream side valve and the upstream side valve are closed, and acquire a second pressure detection value when the bypass side valve, the downstream side valve, and the upstream side valve are opened, from the pressure gauge,
calculate a pressure difference between the first and second pressure detection values, and
estimate a remaining amount of the raw material within the raw material container based on the calculated pressure difference.

9. A residual estimation method comprising:
circulating a carrier gas through an upstream path connected to a raw material container that accommodates a solid or liquid raw material;
circulating the carrier gas from the upstream path to a downstream path connected to the raw material container through a bypass path that connects the upstream path and the downstream path to each other, without passing through the raw material container;
circulating a gas containing a raw material gas generated from the raw material through the downstream path by controlling a downstream side valve provided in the downstream path, a bypass side vale provided in the bypass path, and an upstream side valve provided in the upstream path;
detecting a pressure within the upstream path or within the downstream path by a pressure gauge provided in at least one of the upstream path and the downstream path;
acquiring a first pressure detection value when the bypass side valve is opened and the downstream side valve and the upstream side valve are closed, and acquiring a second pressure detection value when the bypass side valve, the downstream side valve, and the upstream side valve are opened, from the pressure gauge while supplying a mixed gas of the raw material gas and the carrier gas to the processing container via the downstream path by opening the downstream side valve in a state where the bypass side valve is open and the upstream side valve is closed;
calculating a pressure difference between the first and second pressure detection values; and
estimating the remaining amount of the raw material within the raw material container based on the calculated pressure difference pressure detection value.

* * * * *